(12) United States Patent
Nishiura

(10) Patent No.: US 8,391,006 B2
(45) Date of Patent: Mar. 5, 2013

(54) WATER JACKET FOR COOLING AN ELECTRONIC DEVICE ON A BOARD

(75) Inventor: Koei Nishiura, Tokyo (JP)

(73) Assignee: Advantest Corporation, Tokyo (JP)

( * ) Notice: Subject to any disclaimer, the term of this patent is extended or adjusted under 35 U.S.C. 154(b) by 228 days.

(21) Appl. No.: 12/676,224

(22) PCT Filed: Sep. 14, 2007

(86) PCT No.: PCT/JP2007/067947
§ 371 (c)(1),
(2), (4) Date: Jun. 1, 2010

(87) PCT Pub. No.: WO2009/034641
PCT Pub. Date: Mar. 19, 2009

(65) Prior Publication Data
US 2010/0271779 A1    Oct. 28, 2010

(51) Int. Cl.
H05K 7/20 (2006.01)
F28F 7/00 (2006.01)
H01L 23/34 (2006.01)
G01N 1/22 (2006.01)

(52) U.S. Cl. .......... 361/699; 361/679.53; 361/719; 165/80.5; 165/104.33; 165/80.4; 257/714; 174/15.1; 73/863.11

(58) Field of Classification Search ............. 361/679.53, 361/699, 702, 719; 165/80.4–80.5, 104.33; 257/714–716; 174/15.1; 73/863.11
See application file for complete search history.

(56) References Cited

U.S. PATENT DOCUMENTS

| | | | | |
|---|---|---|---|---|
| 4,884,168 A | * | 11/1989 | August et al. | 361/702 |
| 6,052,284 A | * | 4/2000 | Suga et al. | 361/699 |
| 6,166,907 A | * | 12/2000 | Chien | 361/699 |
| 2002/0005272 A1 | * | 1/2002 | Hirano et al. | 165/80.3 |
| 2004/0256092 A1 | * | 12/2004 | Winslow et al. | 165/168 |
| 2005/0056102 A1 | * | 3/2005 | Nishiura | 73/863.11 |
| 2006/0291165 A1 | * | 12/2006 | Flesch et al. | 361/699 |

FOREIGN PATENT DOCUMENTS

| | | |
|---|---|---|
| JP | 10-51169 | 2/1998 |
| JP | 10-303586 | 11/1998 |
| JP | 2001-168566 | 6/2001 |
| JP | 2001-237486 | 8/2001 |
| JP | 2002-280507 | 9/2002 |
| JP | 2003-224238 | 8/2003 |
| JP | 2004-193389 | 7/2004 |
| JP | 2004-221315 | 8/2004 |
| JP | 2005-45027 | 2/2005 |
| WO | WO 2007/089011 | * 8/2007 |

* cited by examiner

Primary Examiner — Zachary M Pape
(74) Attorney, Agent, or Firm — Greenblum & Bernstein, P.L.C.

(57) ABSTRACT

A water jacket includes a channel which accommodates MCM and through which a coolant runs, and the channel has a throttle part of which a flow passage sectional area is smaller than other parts and which is at the upstream of the MCM.

2 Claims, 23 Drawing Sheets

COOLANT

US 8,391,006 B2

WATER JACKET FOR COOLING AN ELECTRONIC DEVICE ON A BOARD

TECHNICAL FIELD

The present invention relates to a water jacket mounted on a board for cooling an electronic device mounted on the board and to an electronic device cooling apparatus and electronic device test apparatus with the same.

BACKGROUND ART

In the process of production of various electronic devices such as semiconductor integrated circuit devices (below, also simply referred to as DUTs (devices under test)), an electronic device test apparatus is used to test the DUTs for performance and function. This electronic device test apparatus comprises: a tester body sending a test signal to a DUT and inspecting a response signal; a test head connected to this tester body and having a socket for electrically contacting the DUT; and a handler successively conveying DUTs over the test head and classifying DUTs finished being tested according to test results. Tests by this electronic device test apparatus are conducted in a state with the handler giving the DUT a high temperature or low temperature thermal stress.

The test head of such an electronic device test apparatus comprises a large number of pin electronics cards used as electrical interfaces between DUTs and the tester body. Each of the pin electronics card comprises a board on which a large number of test use high frequency circuits, power circuits, and various other types of test devices are mounted.

Among the test devices mounted on the pin electronics cards, there are ones which become high in temperature when testing the DUTs due to their self generated heat. As opposed to this, in order to cool the test devices becoming high temperature due to the self generated heat by direct immersion in a coolant, a water jacket covering the test devices mounted on the pin electronics card has been conventionally known (for example, see Patent Citations 1 and 2).

In the above water jacket, the channel through which the coolant runs has a constant flow passage sectional area. For this reason, when the flow volume of the coolant supplied to the water jacket is limited to a certain volume, there has been a limit to the improvement of the cooling efficiency.

[Patent Citation 1] Japanese Patent Publication (A) No. 10-51169

[Patent Citation 2] Japanese Patent Publication (A) No. 10-303586

DISCLOSURE OF INVENTION

Technical Problem

The problem to be solved by the present invention is to provide a water jacket able to improve the cooling efficiency and an electronic device cooling apparatus and electronic device test apparatus with the same.

Solution to Problem

To achieve this object, according to the present invention, there is provided a water jacket mounted on a board for cooling an electronic device mounted on the board by a coolant, comprising a channel which accommodates the electronic device and through which the coolant runs, wherein the channel has a throttle part of which a flow passage sectional area is smaller than other parts and which is at the upstream of the electronic device (see claim 1).

While not particularly limited in the invention, preferably the throttle part has an opening width smaller than the electronic device (see claim 2).

While not particularly limited in the invention, preferably the throttle part is provided along a direction of flow of the coolant on the same line as a semiconductor chip of the electronic device (see claim 3).

While not particularly limited in the invention, preferably comprising an orienting means for orienting the coolant to the semiconductor chip of the electronic device (see claim 4).

While not particularly limited in the invention, preferably the throttle part is provided at the downstream of the electronic device as well (see claim 5).

While not particularly limited in the invention, preferably the channel accommodates a plurality of the electronic devices in an aligned state, and a plurality of the throttle parts are respectively provided at the upstream of the electronic devices (see claim 6).

While not particularly limited in the invention, preferably the plurality of throttle parts have opening widths which are different mutually in accordance with the amounts of generation of heat of the electronic devices (see claim 7).

While not particularly limited in the invention, preferably the more the throttle part is downstream, the narrower the opening width of the throttle part is (see claim 8).

While not particularly limited in the invention, preferably the channel has a partition partitioning the electronic devices, and the throttle part is provided at the partition (see claim 9).

While not particularly limited in the invention, preferably the partitions includes a first partition and a second partition adjoining the first partition, and the first partition is branched from the second partition (see claim 10).

While not particularly limited in the invention, preferably the channel has a step part which is between a first semiconductor chip of the electronic device and a second semiconductor chip of the electronic device and reduces the flow passage sectional area from the upstream to the downstream (see claim 11).

While not particularly limited in the invention, preferably the channel has a turbulence generating means for generating turbulence in the coolant (see claim 12).

To achieve the above object, according to the present invention, there is provided an electronic device cooling apparatus for cooling an electronic device mounted on a board by a coolant, comprising: the above water jacket; and a coolant supplying means for supplying coolant to the channel of the water jacket (see claim 13).

Further, to achieve the above object, according to the present invention, there is provided an electronic device test apparatus for testing an electronic device under test, comprising: a contact part electrically contacting the electronic device under test; a board on which a test electronic device is mounted and which is electrically connected to the contact part; and the electronic device cooling apparatus, wherein the water jacket of the electronic device cooling apparatus is mounted on the board for cooling the test device by a coolant (see claim 14).

Advantageous Effects of Invention

In the present invention, by running a coolant through a throttle part which has a flow passage sectional area is smaller than other parts in a channel, the coolant rises in flow rate, so the cooling efficiency of an electronic device by the coolant can be raised.

REFERENCE SIGNS LIST

Figure 1:
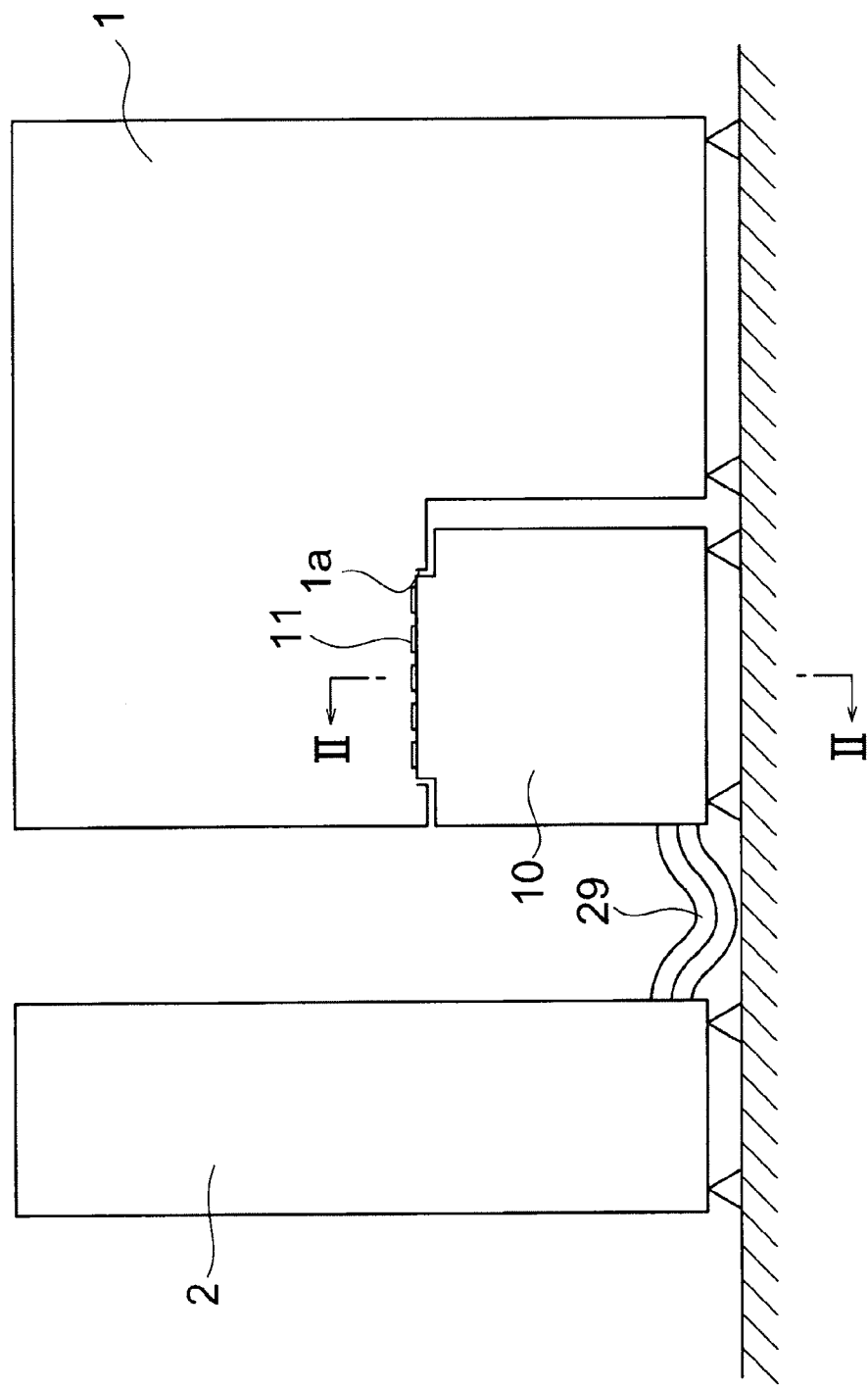
FIG. 1 is a schematic cross-sectional view showing an electronic device test apparatus in a first embodiment of the present invention.

10 . . . test head
20 . . . pin electronics card
21 . . . test device
22A . . . MCM
24 . . . card board
30 . . . electronic device cooling apparatus
40 . . . chiller
50 . . . water jacket 51 . . . channel
51d . . . step part
52 . . . partition
53 . . . block
54, 541 to 549 . . . throttle part
55 . . . current plate
56A, 56B . . . baffle
57 . . . seal member
60 . . . semiconductor package

BEST MODE FOR CARRYING OUT THE INVENTION

Below, embodiments of the present invention will be explained based on the drawings.

Figure 2:
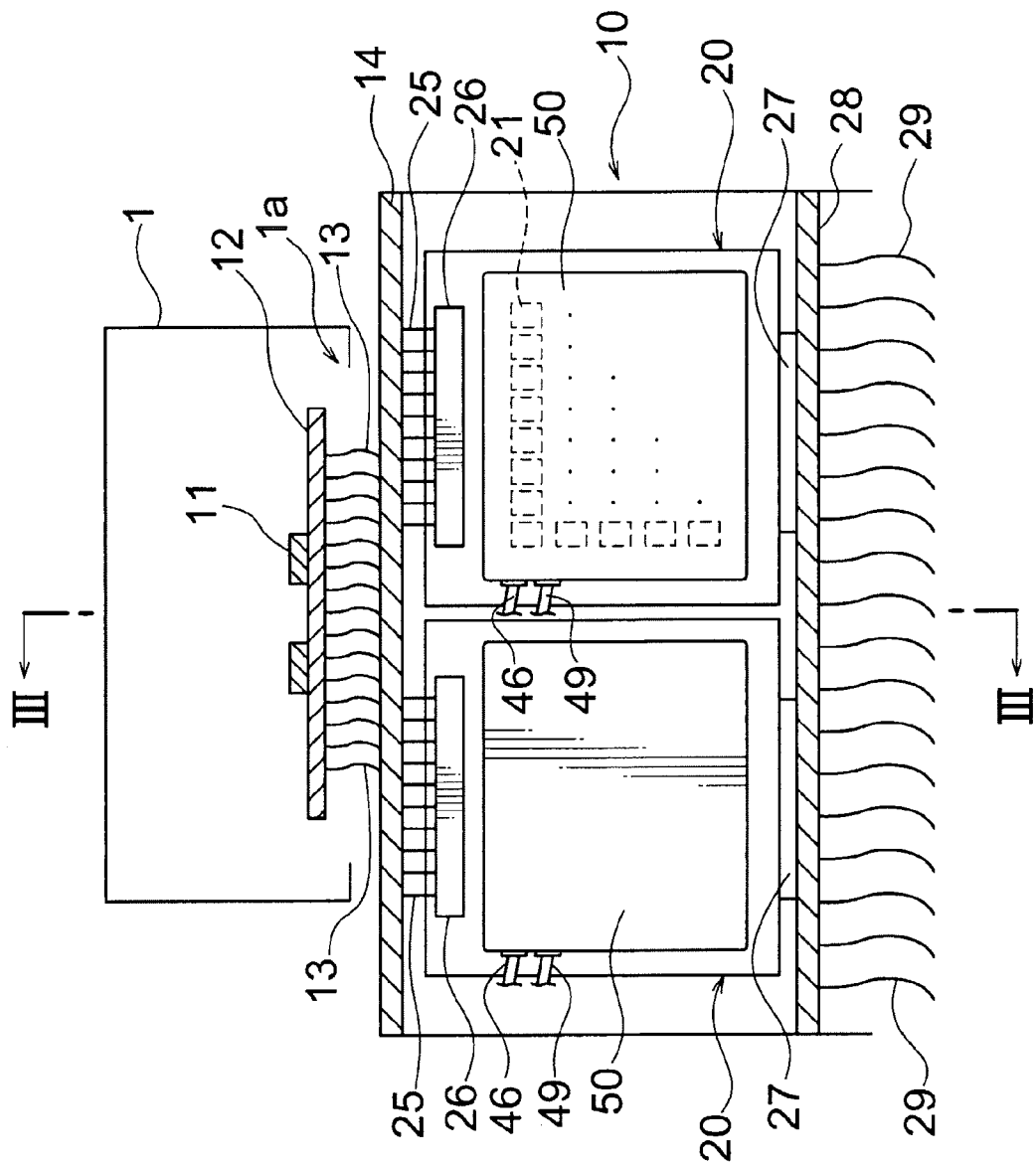
FIG. 2 is a cross-sectional view of a test head along a line II-II of FIG. 1.
Figure 3:
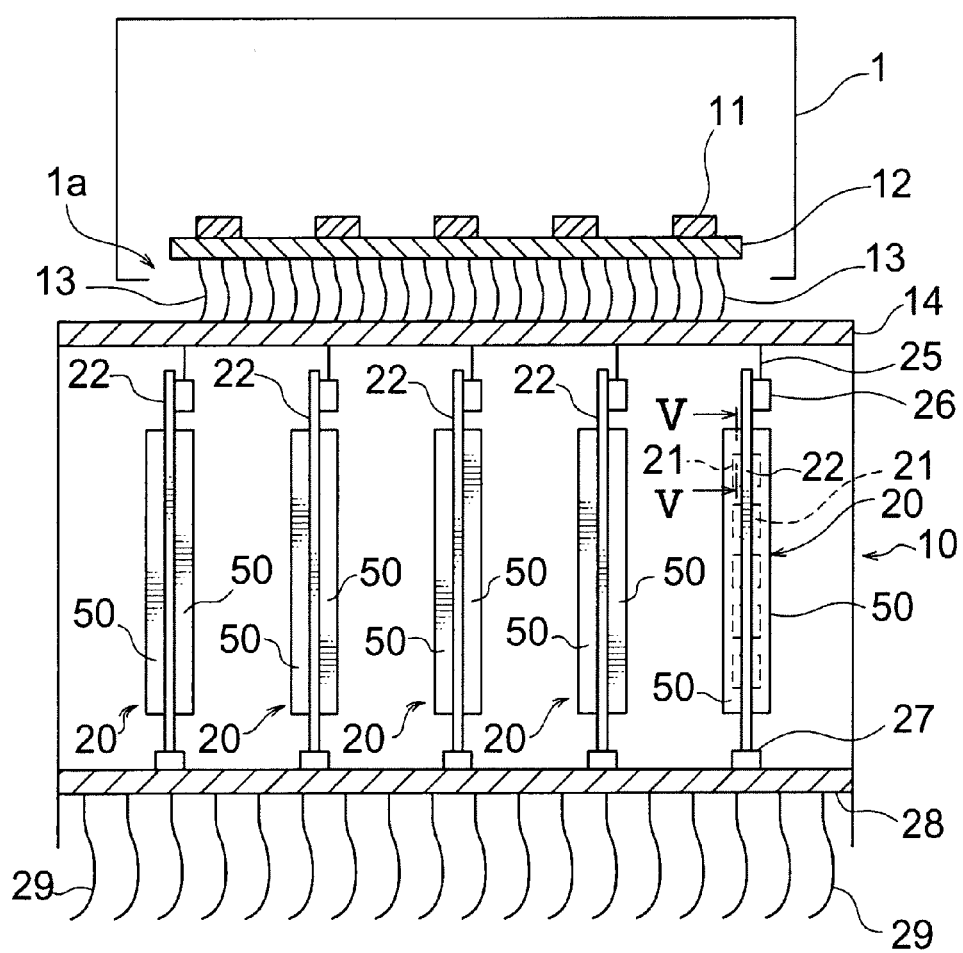
FIG. 3 is a cross-sectional view along a line III-III of FIG. 2.
Figure 4:
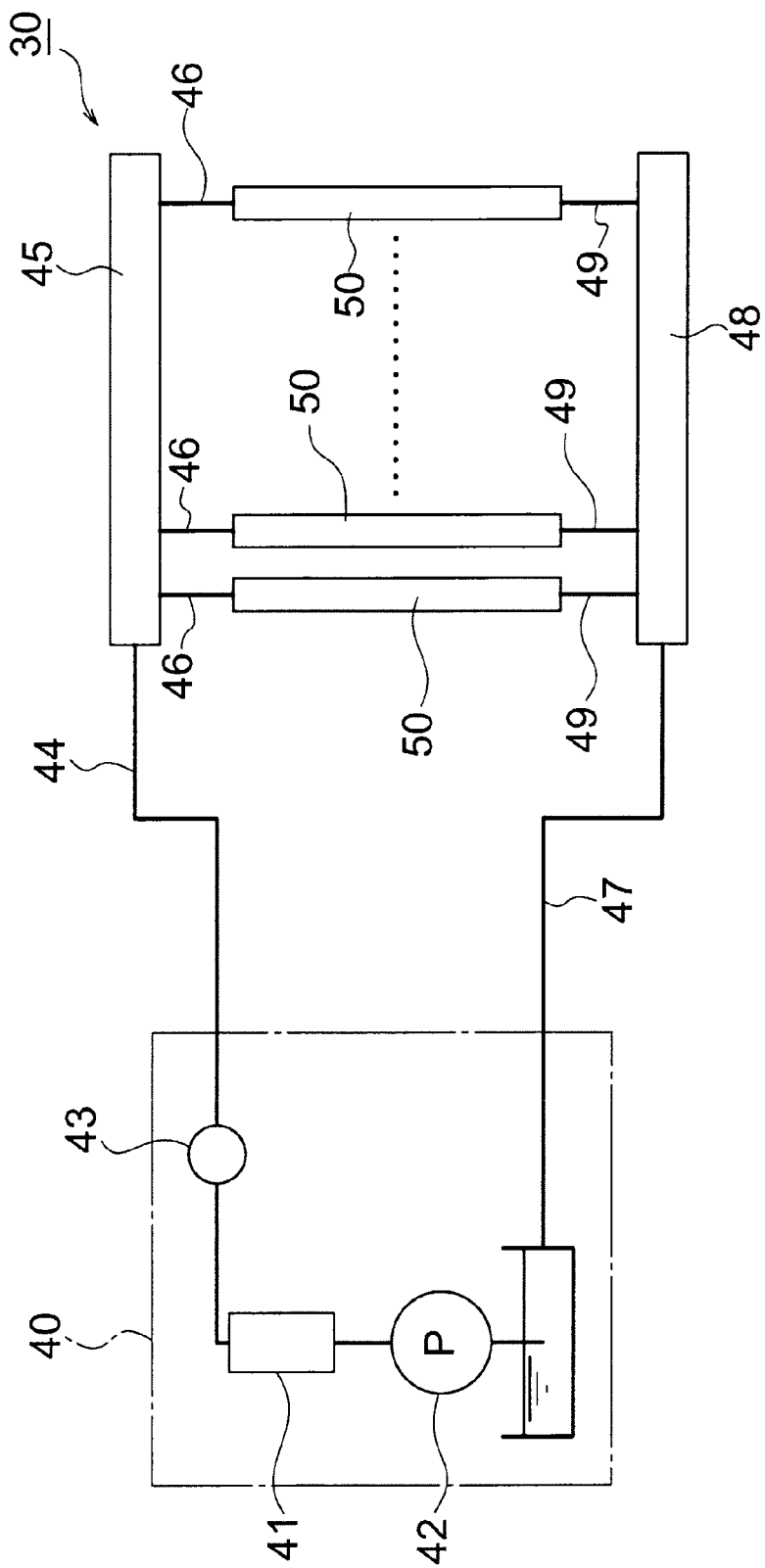
FIG. 4 is a block diagram showing an electronic device cooling apparatus in a first embodiment of the present invention.
Figure 5:
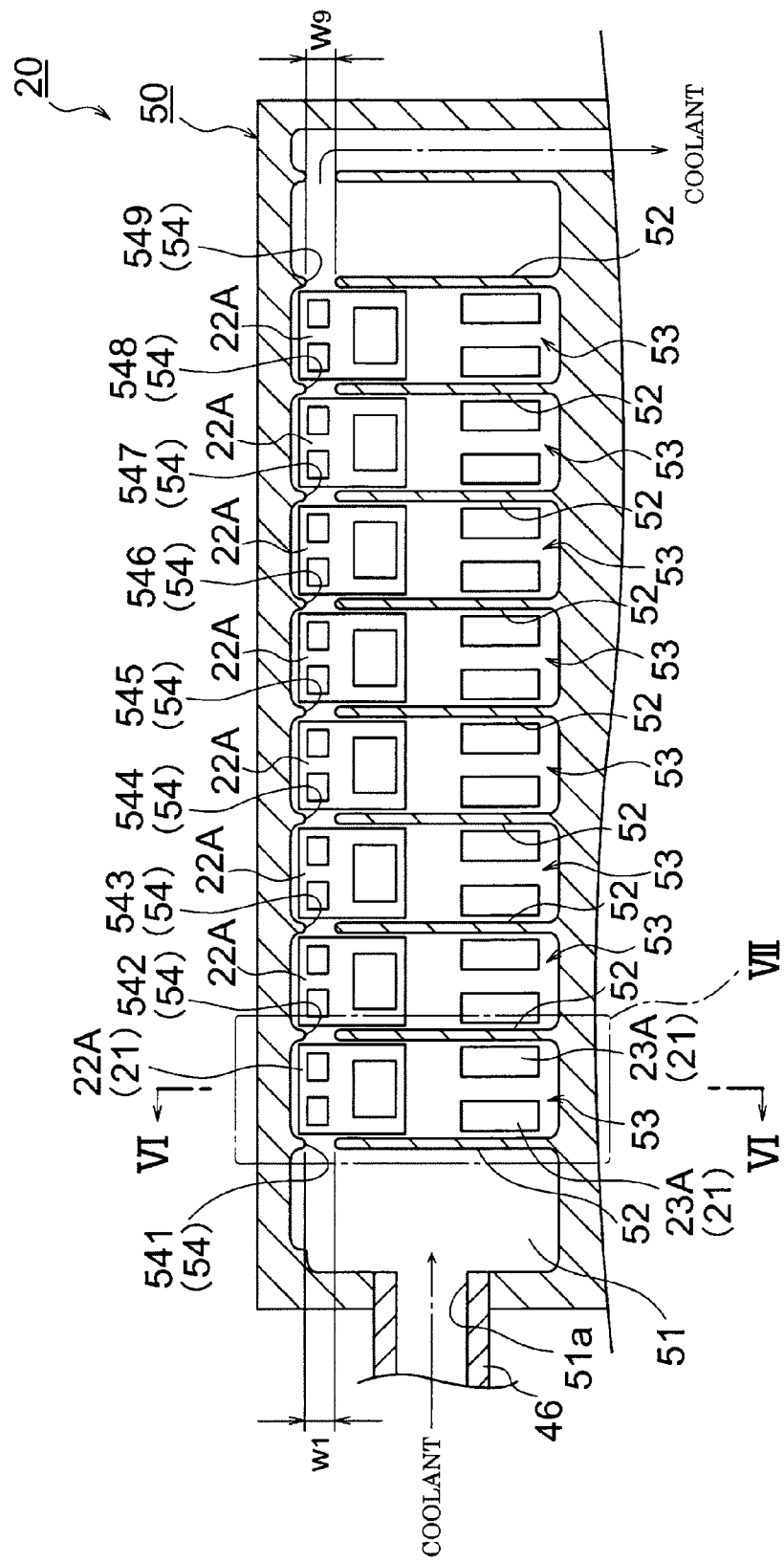
FIG. 5 is a cross-sectional view showing a water jacket along a line V-V of FIG. 3.
Figure 6:
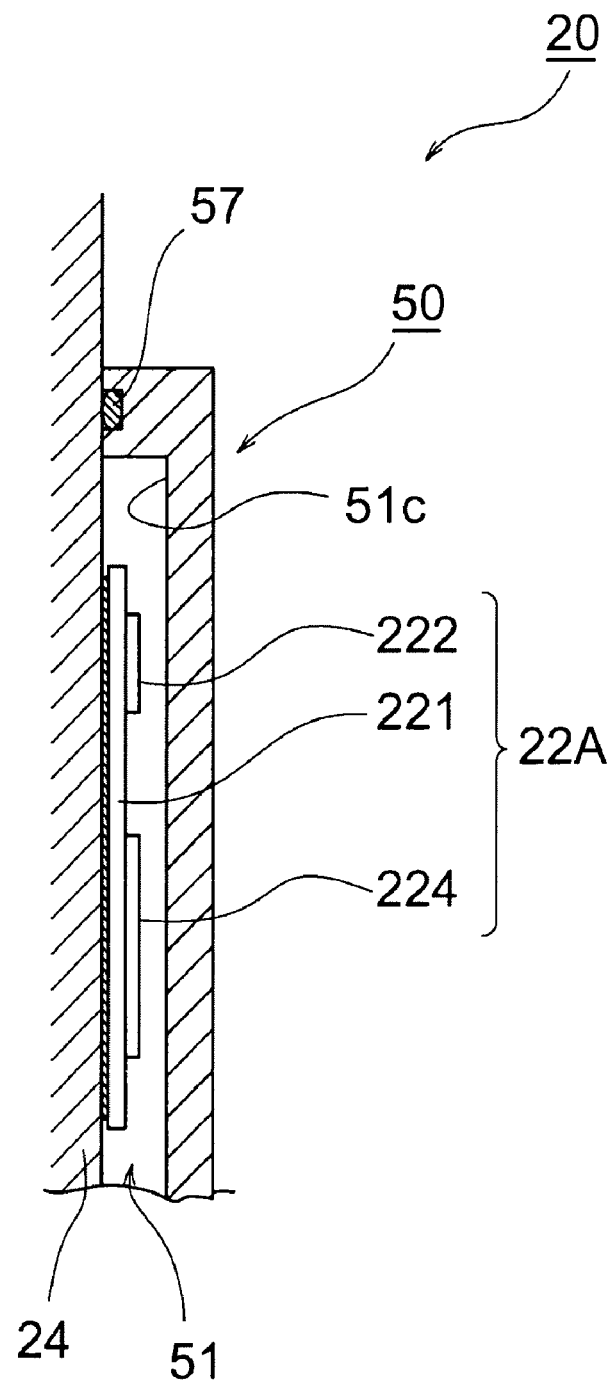
FIG. 6 is a cross-sectional view along a line VI-VI of FIG. 5
Figure 7:
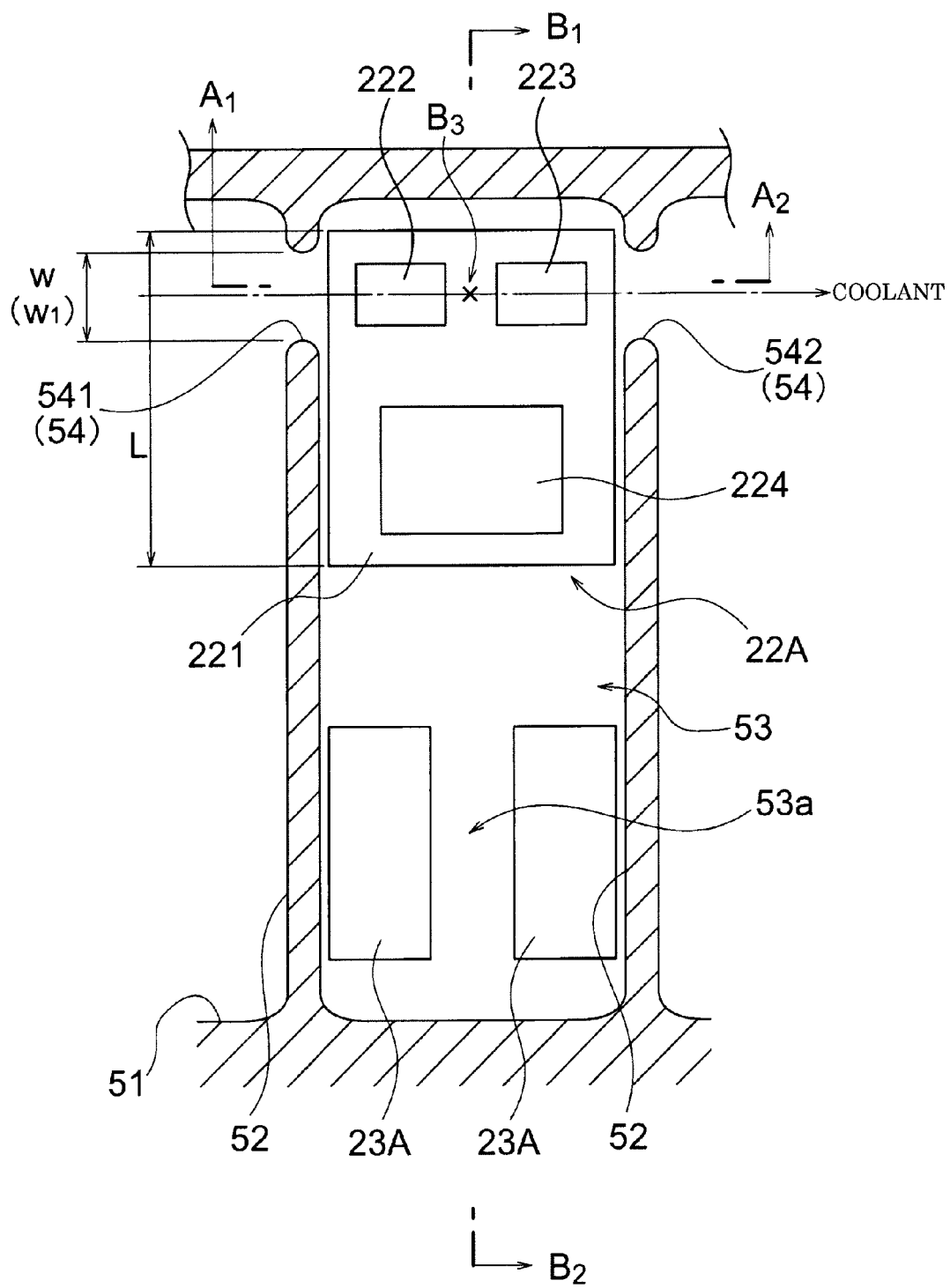
FIG. 7 is an enlarged view of a part VII of FIG. 5.
Figure 8:
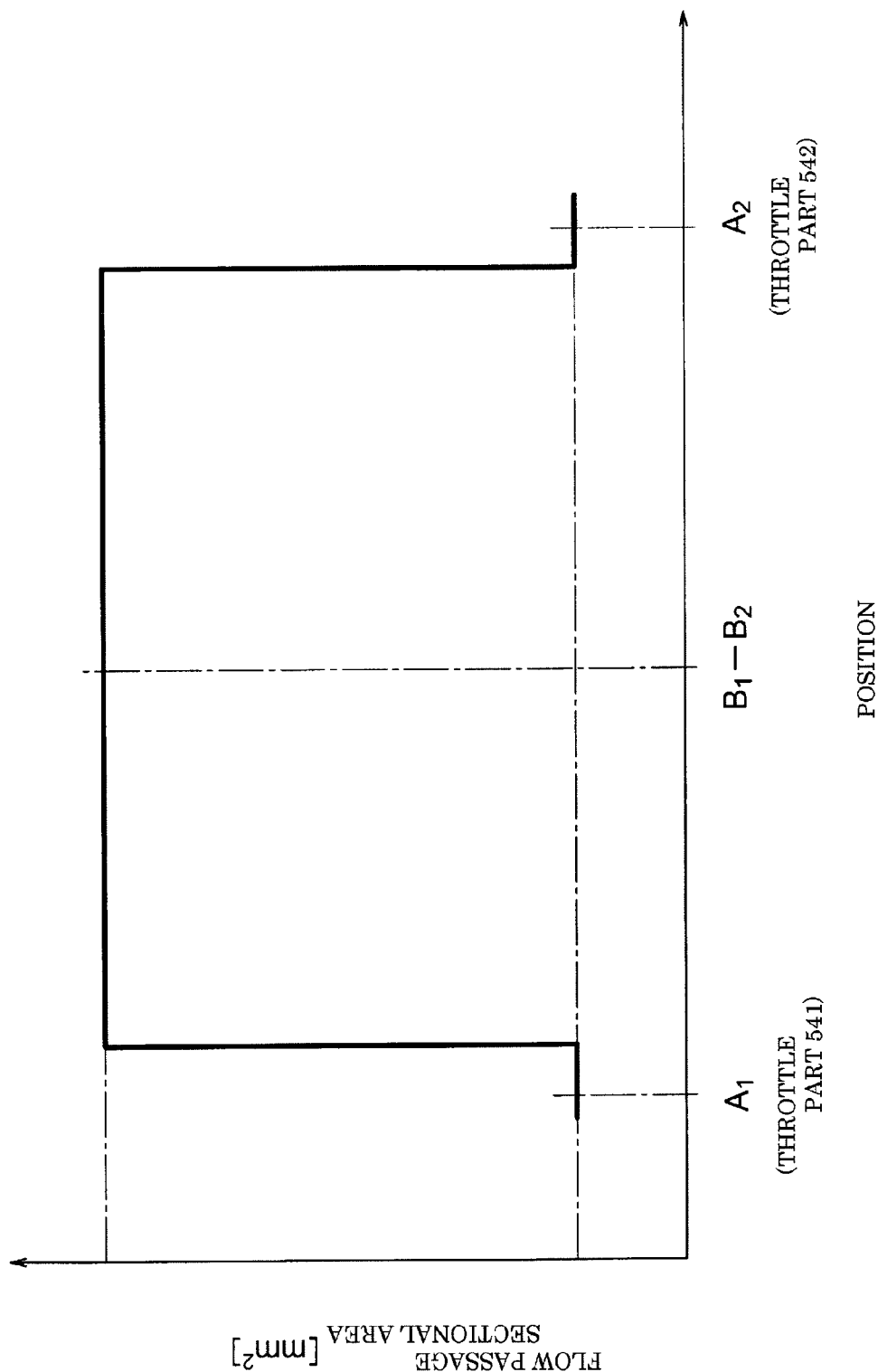
FIG. 8 is a graph showing a flow passage sectional area of a channel along a line $A_1$-$A_2$ of FIG. 7.
Figure 9:
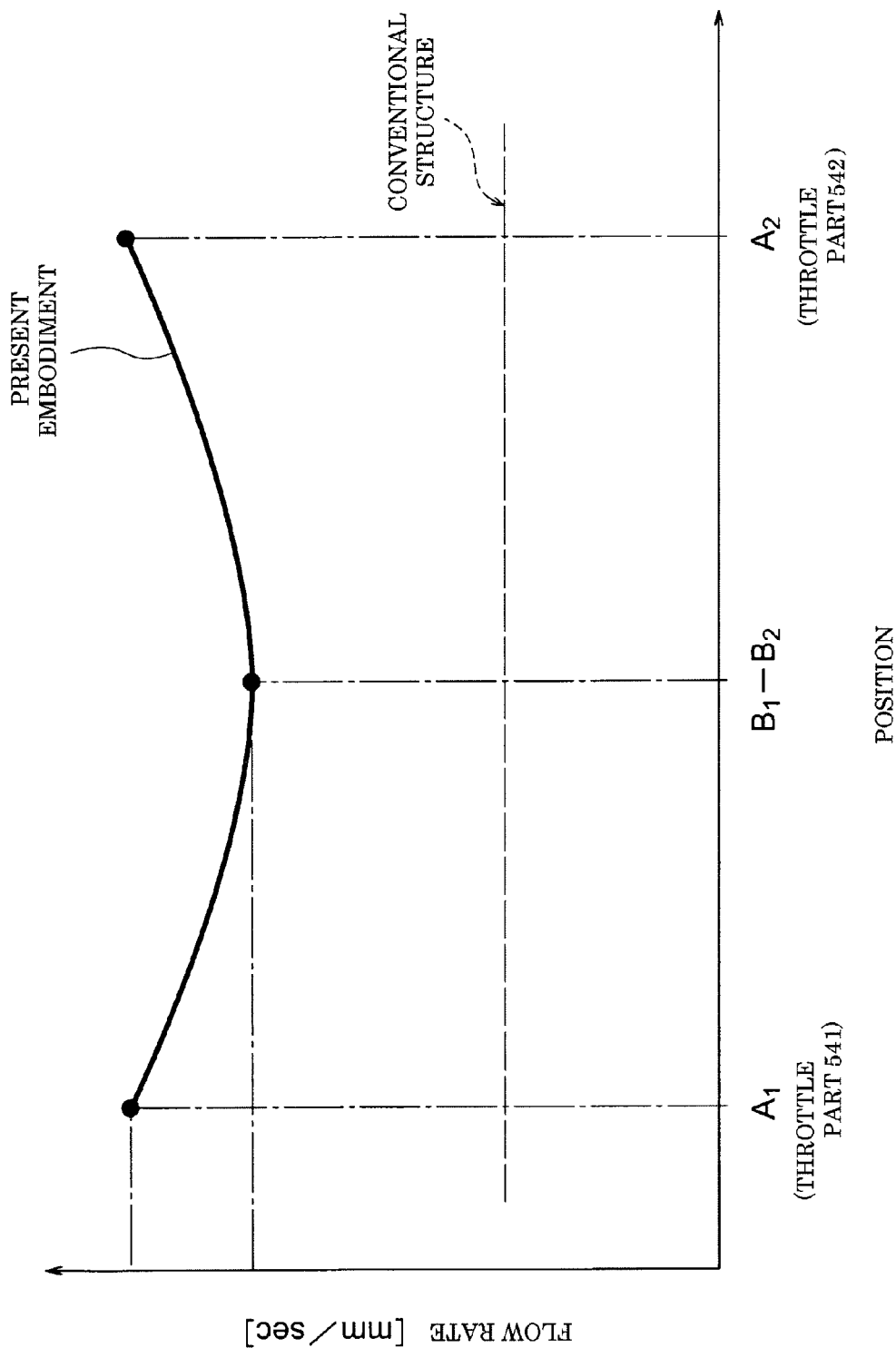
FIG. 9 is a graph showing a distribution of flow rate of a coolant along a line $A_1$-$A_2$ of FIG. 7.
Figure 10:
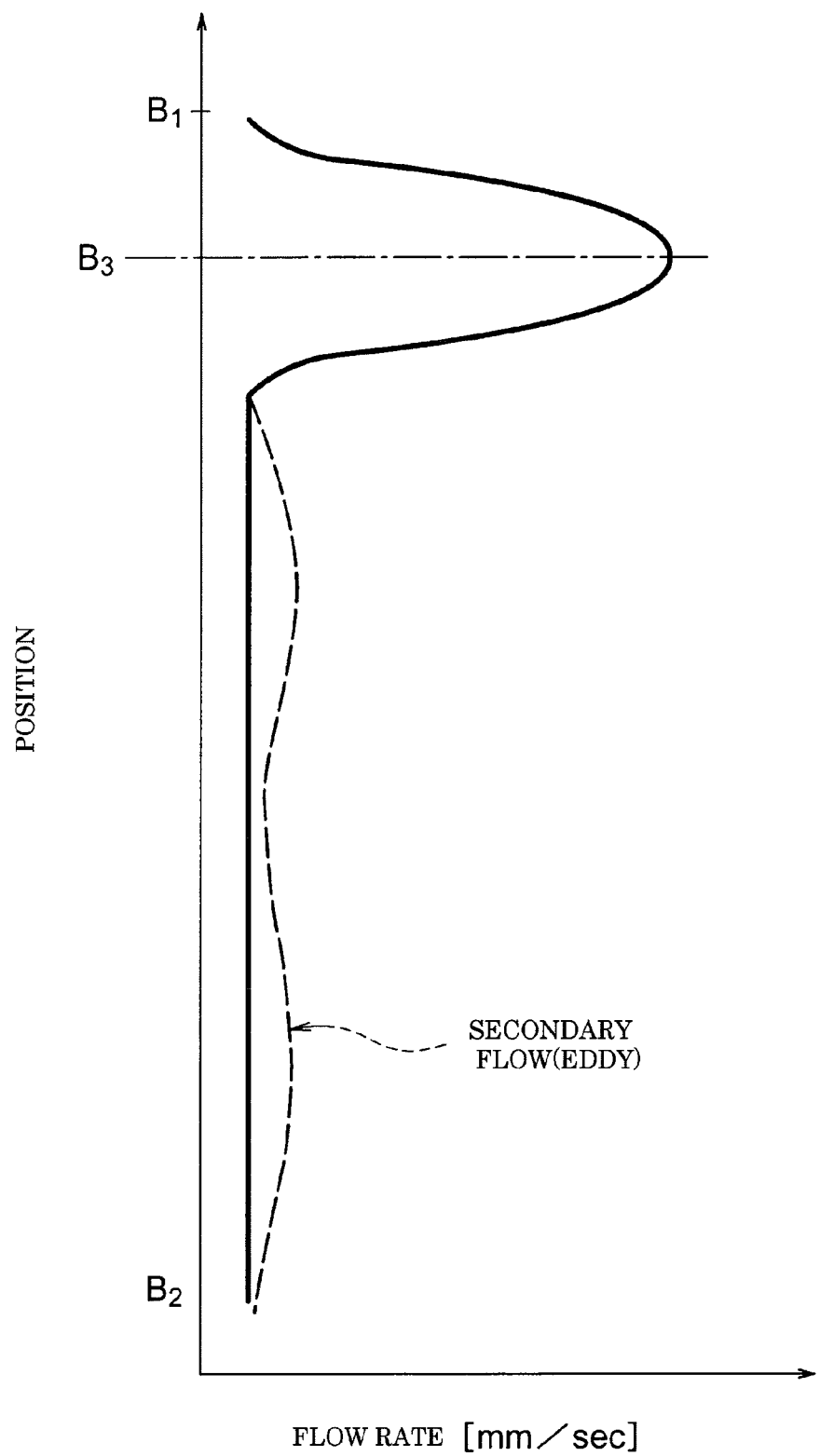
FIG. 10 is a graph showing a distribution of flow rate of a coolant along a line $B_1$-$B_2$ of FIG. 7.
Figure 11:
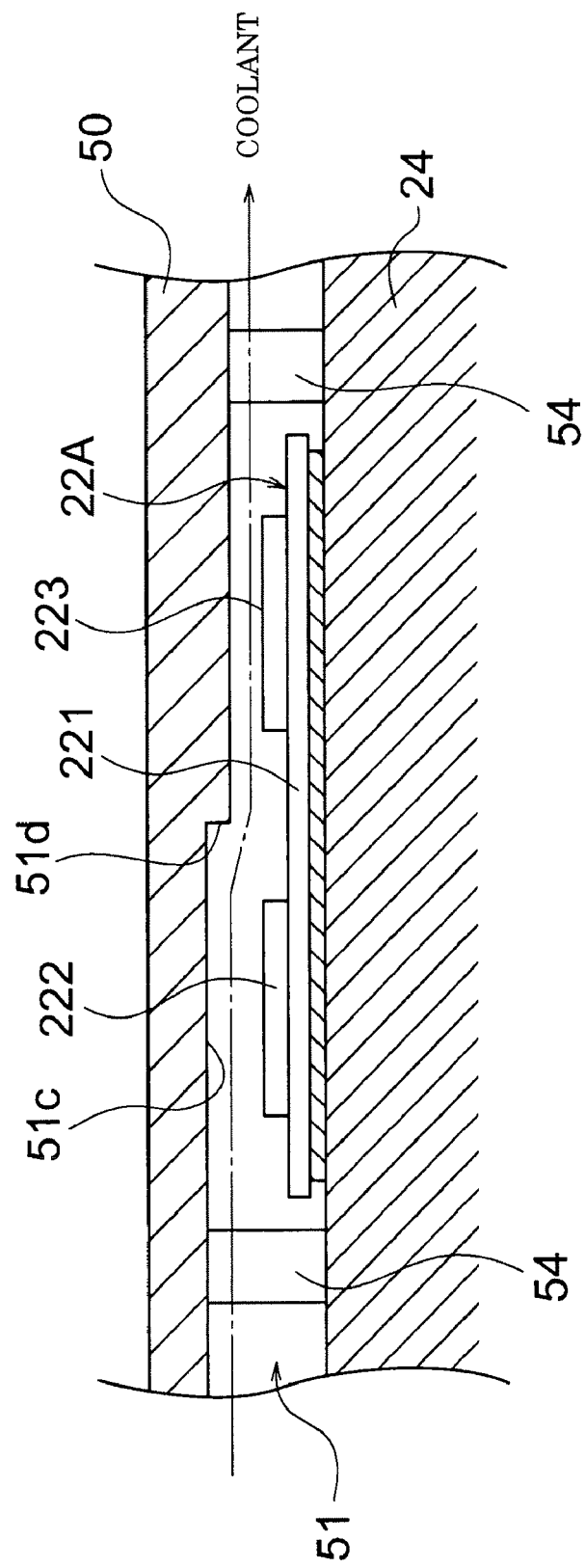
FIG. 11 is a cross-sectional view along a line $A_1$-$A_2$ of FIG. 7.
Figure 12:
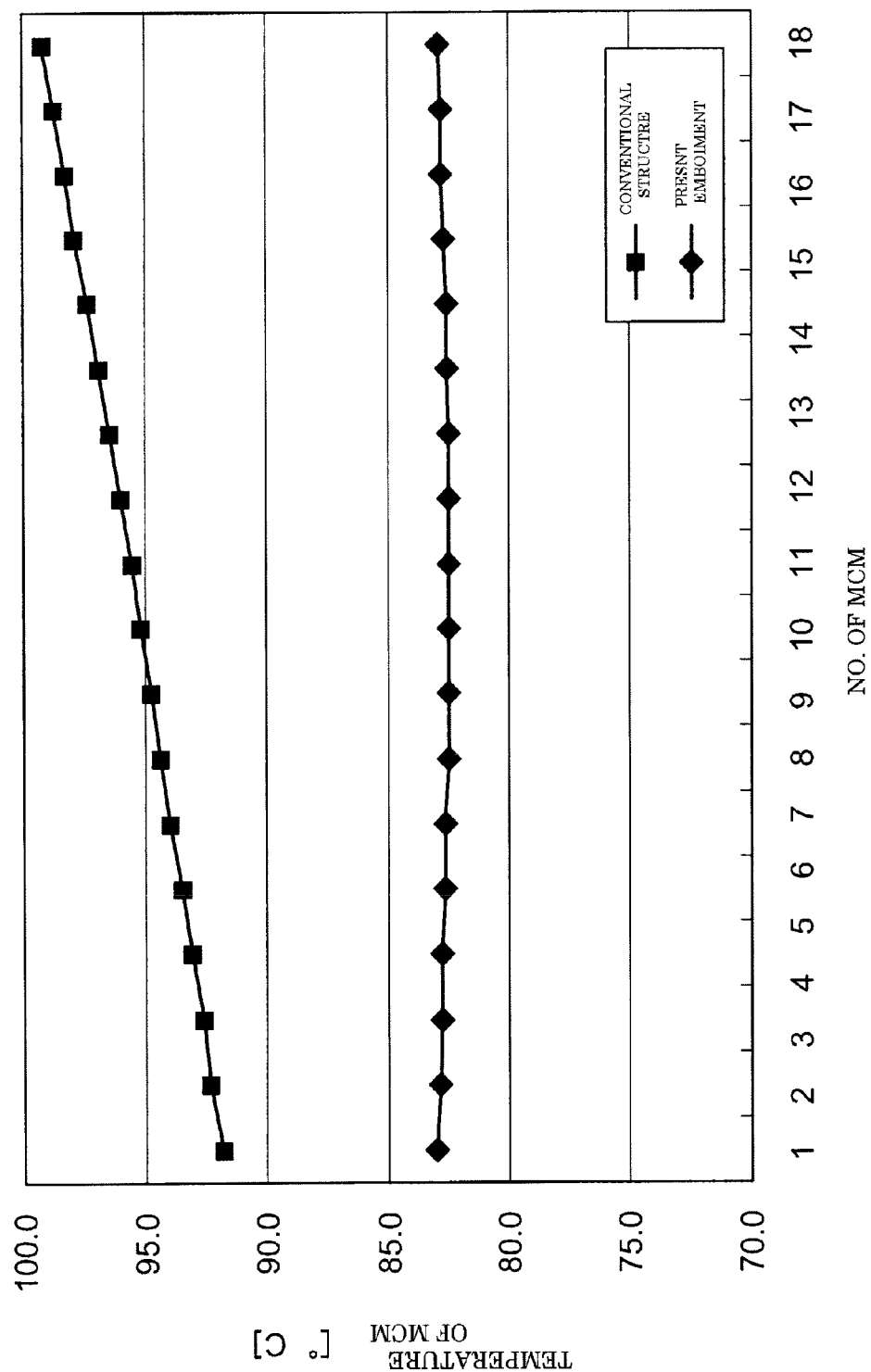
FIG. 12 is a graph comparing a cooling performance of a water jacket according to a first embodiment of the present invention and a water jacket of a conventional structure.

FIG. 1 is a schematic cross-sectional view showing an electronic device test apparatus in a first embodiment of the present invention, FIG. 2 and FIG. 3 are cross-sectional views of a test head in a first embodiment of the present invention, FIG. 4 is a block diagram showing an electronic device cooling apparatus in a first embodiment of the present invention, FIG. 5 is a cross-sectional view showing a water jacket along a line V-V of FIG. 3, FIG. 6 is a cross-sectional view along a line VI-VI of FIG. 5, FIG. 7 is an enlarged view of a part VII of FIG. 5, FIG. 8 is a graph showing a flow passage sectional area of a channel along a line $A_1$-$A_2$ of FIG. 7, FIG. 9 is a graph showing a distribution of flow rate of a coolant along a line $A_1$-$A_2$ of FIG. 7, FIG. 10 is a graph showing a distribution of flow rate of a coolant along a line $B_1$-$B_2$ of FIG. 7, FIG. 11 is a cross-sectional view along a line $A_1$-$A_2$ of FIG. 7, and FIG. 12 is a graph comparing a cooling performance of a water jacket according to a first embodiment of the present invention and a water jacket of a conventional structure.

The electronic device test apparatus in the first embodiment of the present invention, as shown in FIG. 1, for example, comprises: a handler 1 for handling a DUT; a test head 10 to be electrically connected to a DUT; and a tester body 2 for sending a test signal through the test head 10 to a DUT to run a test on the DUT. This electronic device test apparatus tests (inspects) whether the DUT is suitably operating in the state applying high temperature or low temperature thermal stress to the DUT and classifies the DUT according to the test results.

As shown in FIG. 1, a socket 11 which electrically contacting a DUT when testing the DUT is provided at the top of the test head 10. This socket 11, as shown in the same figure, approaches the inside of the handler 1 through an opening 1a formed in the handler 1. The DUT conveyed in the handler 1 is pushed against this socket 11. Note that, as the handler 1, a heat plate type or chamber type may be used.

The socket 11 has a large number of contact pins (not shown) electrically contacting input/output terminals of the DUT and, as shown in FIG. 2 and FIG. 3, is mounted on a socket board 12. The socket board 12 is electrically connected to a performance board 14 through a cable 13. In the present embodiment, for example, 10 sockets 11 are arranged in two rows and five columns on the socket board 12.

A plurality of (in the present example, 10) pin electronics cards 20 are housed inside the test head 10. The performance board 14 is electrically connected to the pin electronics cards 20.

In the present embodiment, as shown in FIG. 2 and FIG. 3, a holder 26 holding a plurality of pins 25 is provided at the top end of each pin electronics card 20. Each of the pins 25 contacts a pad provided at the bottom of the performance board 14 whereby the performance board 14 and the pin electronics card 20 are electrically connected. Note that, in the present invention, the method of connection of the performance board 14 and a pin electronics card 20 is not limited to the above. For example, a method of connection using cables, connectors, etc. is also possible.

A connector 27 is provided at the bottom end of each pin electronics card 20. This connector 27 is connected to a back board 28 positioned at the bottom of the test head 10. Furthermore, this back board 28 is connected to the tester body 2 through cables 29.

Note that, in the present embodiment, 10 pin electronics cards 20 are arranged in an upright stance, but the invention is not particularly limited to this. Any number of pin electronics cards can be set. Further, the pin electronics cards can be provided along the horizontal direction.

Each of pin electronics cards 20 comprises: a plurality of test devices 21 used for testing a DUT; and a card board 24 on the both sides of which the test devices 21 mounted. As specific examples of the test devices 21, for example, a high frequency circuit in which an LSI etc. is built for handling test signals, a power circuit in which a switching regulator for supplying test power to a DUT is built, etc. may be mentioned. Further, as specific examples of the card board 24, for example, a printed circuit board composed of a glass epoxy resin etc., glass board, ceramic board, etc. may be illustrated. This pin electronics card 20, as explained later, has water jackets 50 for cooling the test devices 21 attached to its both sides.

Furthermore, the electronic device test apparatus in the present embodiment comprises an electronic device cooling apparatus 30 for cooling the test devices 21 mounted on the pin electronics cards 20. This electronic device cooling apparatus 30, as shown in FIG. 4, comprises: water jackets 50 mounted on pin electronics cards 20; a chiller 40 for supplying coolant to the water jackets 50; and piping 44 to 49 for circulating coolant between the water jackets 50 and chiller 40. The chiller 40 has: a heat exchanger 41 for cooling the coolant; a pump 42 for pumping the coolant; and a pressure switch 43 for defining an upper limit of pressure of the coolant. Note that, as a specific example of the coolant for cooling the test devices 21, for example, a fluorine-based inert liquid (for example, Fluorinert® made by 3M) or other liquid superior in electrical insulating property may be illustrated.

The coolant pumped out from the pump 42 is cooled by the heat exchanger 41 and then reaches an upstream side branching unit 45 through a main pipe 44. It is split to branch pipes 46 at this branching unit 45 and is supplied to the water jackets 50 (pump 42→heat exchanger 41→main pipe 44→branching unit 45→branch pipes 46→water jackets 50).

On the other hand, coolant running through channels 51 in the water jackets 50 merges at a downstream branching unit 48 through branch pipes 49, and furthermore returns to the pump 42 of the chiller 40 through a downstream main pipe 47 (water jackets 50→branch pipes 49→branching unit 48→main pipe 47→pump 42).

Each water jacket 50 in the present embodiment, as shown in FIG. 5 and FIG. 6, has a channel 51 through which a coolant supplied from the chiller 40 runs. This water jacket 50 is fastened to the card board 24 by screws etc. in the state with the test devices 21 positioned in the channel 51. An O-ring or other seal member 57 is interposed between the card board 24 and the water jacket 50 whereby the inside of the channel 51 is closed. By running a coolant in the channel 51 of this water jacket 50, the coolant directly contacts the test devices 21 to cool the test devices 21. Note that, FIG. 5 only shows the topmost level of the channel 51 in the water jacket 50, but in actuality, for example the channel 51 is formed so as to snake over the entire surface of the water jacket.

MCMs (Multi Chip Modules) 22A having semiconductor chips with particularly large self heat generating properties among the test devices 21 are arranged at the topmost level of the channel 51. Each of these MCMs 22A, as shown in FIG. 7, has three bare chips 222 to 224 and a module board 221 on which these bare chips 222 to 224 are mounted. The first and second bare chips 222, 223 are devices with particularly large self generating heat properties among the three bare chip. As opposed to this, the third bare chip 224 is a device with a small heat generating property in comparison with the first and second bare chips 222, 223. As specific examples of the module board 221, for example, a glass ceramic board or other low heat expansion board may be illustrated.

As shown in FIG. 5, an inlet 51a is formed at the topmost level of the channel 51. This inlet 51a is connected to an upstream side branch pipe 46. In the channel 51, eight MCMs 22A are housed at the downstream of the inlet 51a and arranged in a line. The coolant running around these MCMs 22A, while not particularly shown, snakes along the channel 51 while cooling the other electronic devices on the card board 24, then reaches a downstream side branch pipe 49 connected to an outlet (not shown).

The channel 51 has partitions 52 provided between adjoining MCMs 22A. Blocks 53 are defined between the adjoining partitions 52. Each block 53 houses a single MCM 22A.

Note that, as shown in FIG. 5 and FIG. 7, each block 53 has an enlarged region 53a for housing an electronic device 23A other than the MCM 22A, but when a block 52 houses only an MCM 22A, the enlarged region 53a is unnecessary.

Figure 13:
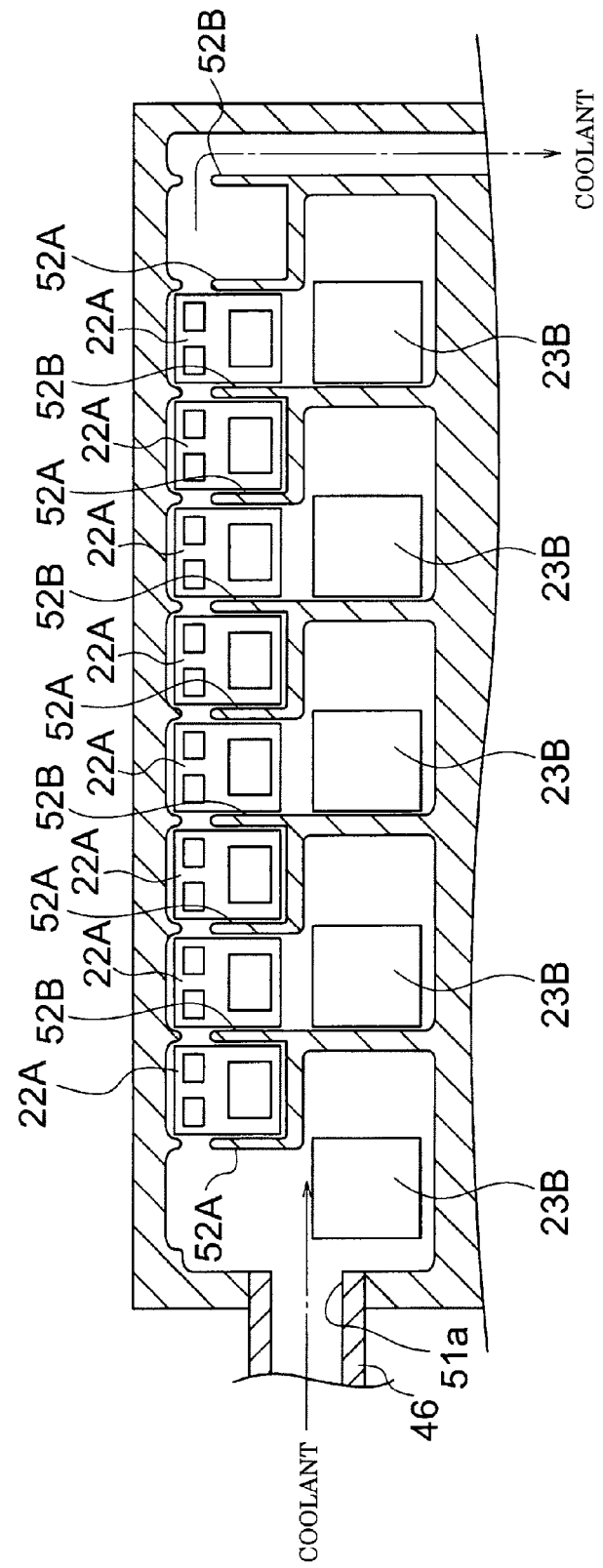
FIG. 13 is a cross-sectional view showing a water jacket in a second embodiment of the present invention.

FIG. 13 is a cross-sectional view showing a water jacket in a second embodiment of the present invention. When the blocks 52 house relatively large sized electronic devices 23B, as shown in FIG. 13, it is also possible to branch the first partitions 52B from the second partitions 52B adjoining the first partitions 52A.

As shown in FIG. 5, each of the partitions 52 is provided with throttle part 54 of which a flow passage sectional area is smaller than other parts in the channel 51. As shown in FIG. 7, the opening width w of the throttle part 54 is smaller than the length L of the whole of MCM 22A along directions substantially perpendicular to the direction of flow of the coolant (w<L). In the present embodiment, the opening width w of the throttle part 54 is about the length of the first bare chip 222 along the longitudinal direction of FIG. 7. As shown in FIG. 8, the flow passage sectional area is narrower at the throttle part 54. Note that, in the present embodiment, the nine throttle parts 541 to 549 are referred to all together as the "throttle part 54" while the opening widths w1 to w9 of the nine throttle parts 541 to 549 are referred to all together as the "opening width w".

In the present embodiment, since the throttle part 54 with the smaller flow passage sectional area is provided at the immediately upstream of the MCM 22A, as shown in FIG. 9, the flow rate of the coolant at downstream of the throttle part 54 rises and the cooling efficiency can be raised in comparison to the conventional structure not provided with the throttle part 54 (in FIG. 9, shown by broken lines). In particular, as shown in FIG. 10, due to the inertia and viscosity of the coolant, the flow rate remarkably arises at the semiconductor chips 21, 22 positioned immediately after the throttle part 54 along the direction of flow of the coolant (position $B_3$ in FIG. 10). Further, due to the rise in flow rate of the coolant, the change in flow line of coolant due to gravity can be suppressed. Furthermore, in the present embodiment, the throttle part 54 is positioned at the downstream of the MCM 22A as well, so divergence of the flow line of the coolant can be suppressed. Note that, in FIG. 10, in actuality, due to the viscosity of the coolant, a secondary flow (eddy) occurs in the enlarged regions 53a resulting in the distribution as shown by the broken line in the figure. Further, in FIGS. 8 to 10, the effects of the step parts 51d explained later are not considered.

As shown in FIG. 7, in the present embodiment, each of the throttle parts 54 is positioned along the flow of the coolant on the same line as the first and second bare chips 222, 223. For this reason, it is possible to intensively make the coolant strike the first and second bare chips 222, 223 and possible to further raise the cooling efficiency.

Further, in the present embodiment, as shown in FIG. 11, a step part 51d is provided at a ceiling 51c between the first bare chip 222 and the second bare chip 223 in the channel 51. Due to this step part 51d, the flow passage sectional area of the channel 51 at the downstream side is smaller than the flow passage sectional area of the channel 51 at the upstream side, and the coolant flowing around the second bare chip 223 is faster than the coolant flowing around the first bare chip 222. When high heat generating bare chips 222, 223 are arranged along the running direction of the coolant, the self generated heat of an upstream side bare chip 222 will cause the temperature of a downstream side bare chip 223 to rise, and therefore a temperature difference will end up being formed between the first and second bare chips 222, 223. As opposed to this, in the present embodiment, the step part 51d of the channel 51 reduces the flow passage sectional area whereby it is possible to cancel out the rise in temperature by the upstream side bare chip 222 and reduce the temperature difference.

Figure 14:
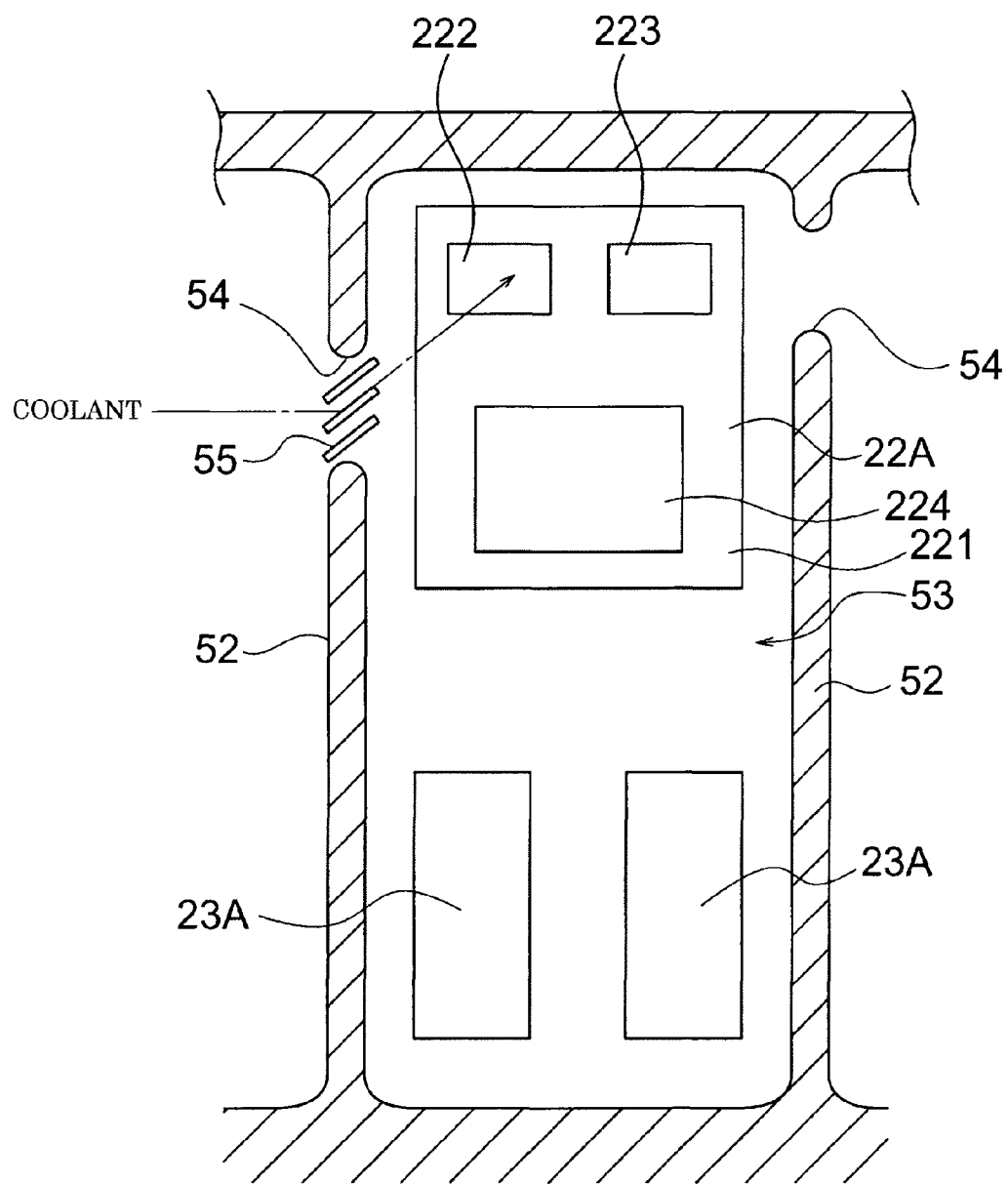
FIG. 14 is an enlarged cross-sectional view showing a water jacket in a third embodiment of the present invention.
Figure 15:
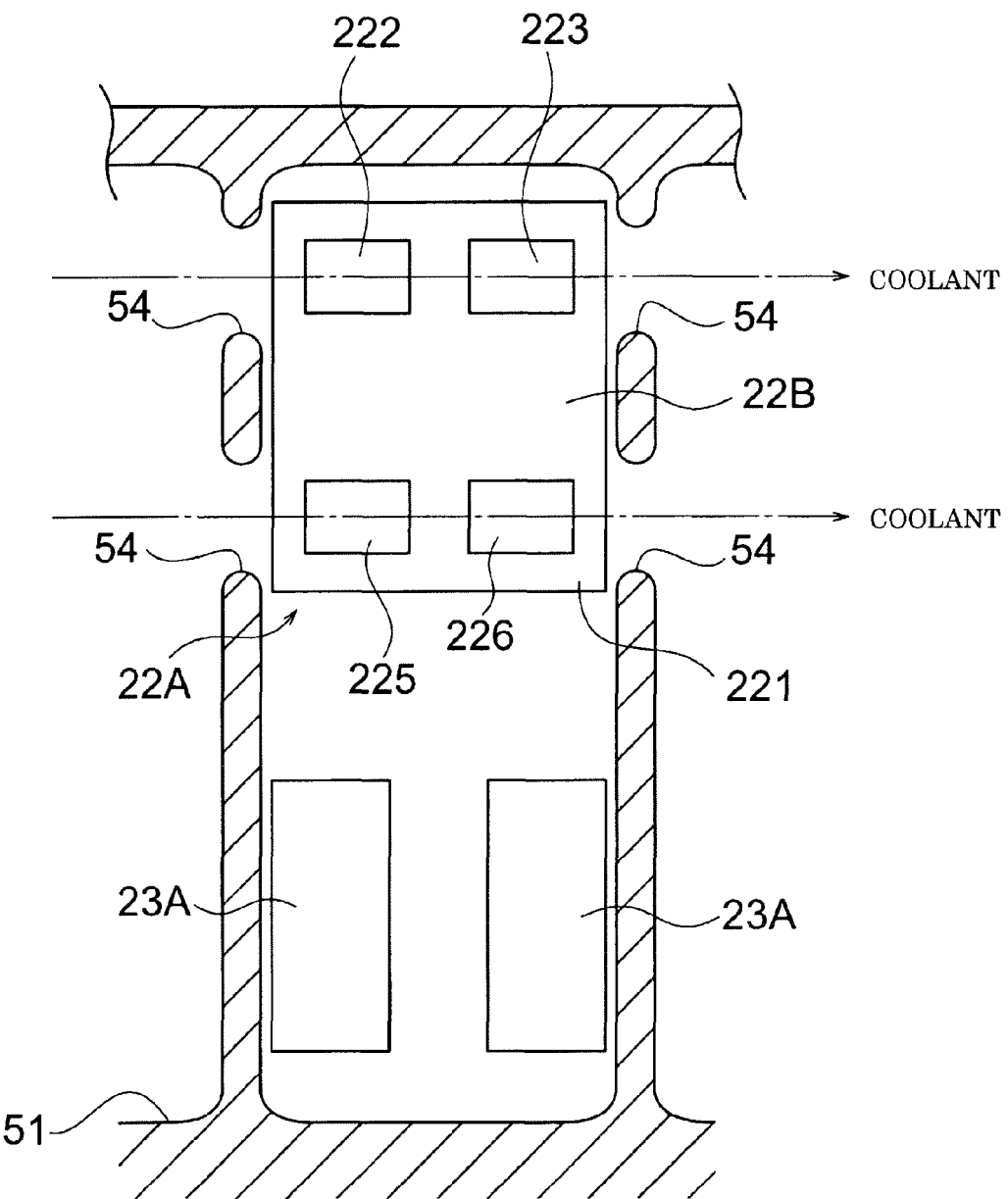
FIG. 15 is an enlarged cross-sectional view showing a water jacket in a fourth embodiment of the present invention.
Figure 16:
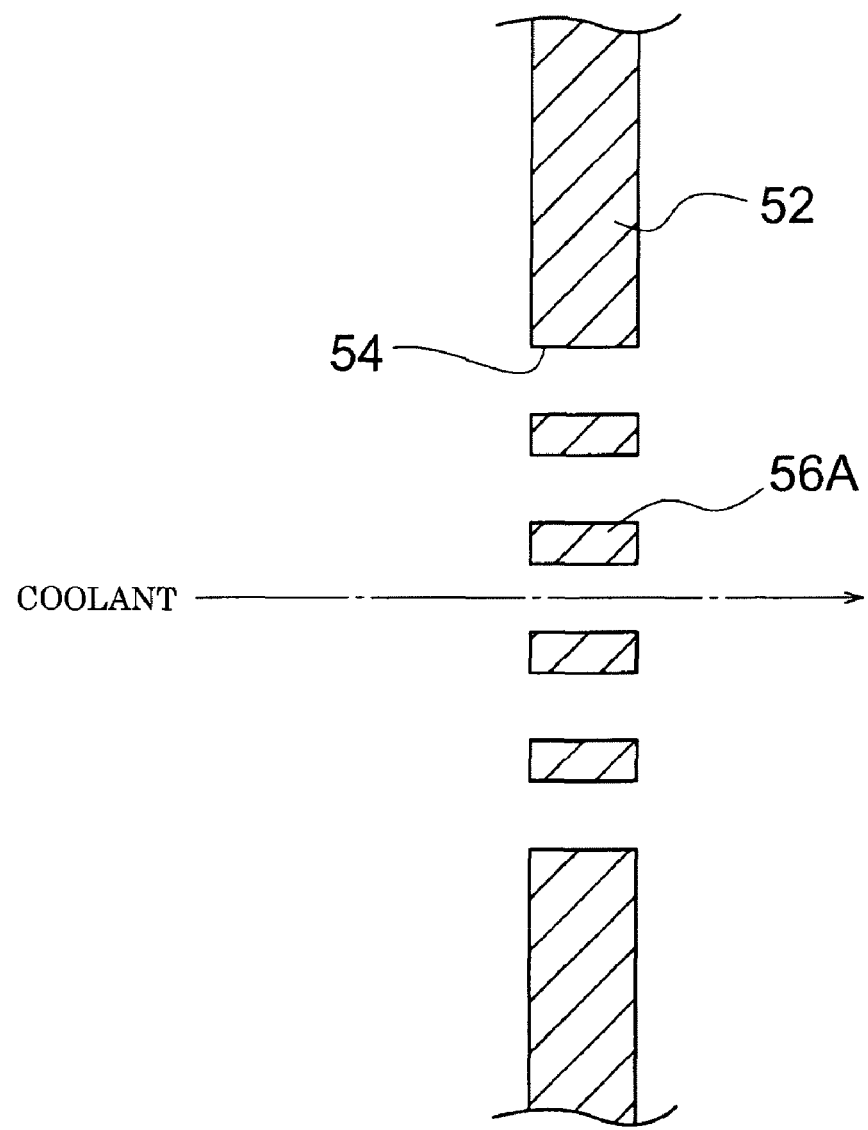
FIG. 16 is an enlarged cross-sectional view showing a throttle part of a water jacket in a fifth embodiment of the present invention.
Figure 17:
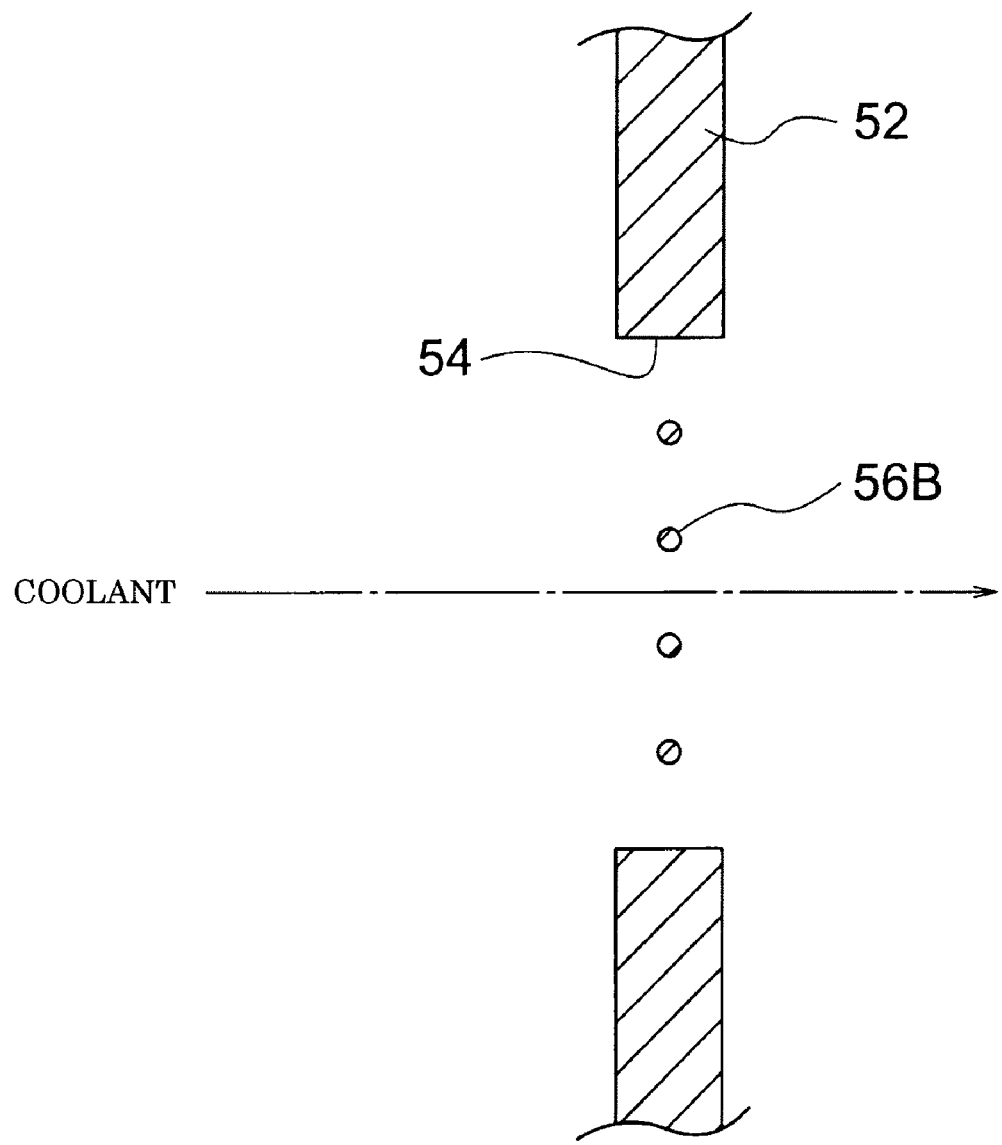
FIG. 17 is an enlarged cross-sectional view showing a throttle part of a water jacket in a sixth embodiment of the present invention.

FIG. 14 and FIG. 15 are enlarged cross-sectional views showing water jackets of third and fourth embodiments of the present invention, while FIG. 16 and FIG. 17 are enlarged cross-sectional views showing throttle parts of water jackets in fifth and sixth embodiments of the present invention.

As shown in FIG. 14, the throttle part 54 need not be provided on the same line as the first and second bare chips 222, 223. The flow of coolant may be directed to the first bare chips 222 by providing current plates 55 at the throttle part 54.

Further, as shown in FIG. 15, when a large number of high heat generating bare chips 222, 223, 225, and 226 are mounted to a single MCM 20B, a plurality of throttle parts 54 may be provided at the partition 51.

Furthermore, as shown in FIG. 16 or FIG. 17, the throttle part 54 may be provided with plate-shaped baffles 56A or columnar shaped baffles 56B to cause turbulence of the coolant above the first and second bare chips 222, 223 of the MCM 22A.

Returning to FIG. 5, in the present embodiment, the opening widths w1 to w9 of the throttle parts 541 to 549 at the partitions 52 are gradually narrower downstream (w1>w2>w3>w4>w5>w7>w8>w9). If making the opening widths of all throttle parts constant, the self generated heat of the upstream side MCMs cause the temperatures of the downstream side MCMs to rise. As shown in FIG. 12, a temperature difference ends up arising between the upstream side MCMs and the downstream side MCMs. As opposed to this, in the present embodiment, according to the above configuration, by raising the flow rate of the coolant downstream, the rise in temperature due to the upstream side MCMs 22A is cancelled out and, as shown in FIG. 12, the temperatures of the MCMs 22A become substantially the same. Note that, in FIG. 5, the opening widths w2 to w8 of the throttle parts 542 to 548 are not illustrated. Further, the number of MCMs in FIG. 12 does not match the number of MCMs 22A in FIG. 5. FIG. 12 shows a modification of the first embodiment. In the present invention, any number of MCMs may be arranged in the channel.

Further, in the past, the temperature of the most-downstream side MCM is used as the standard for design, so the upstream side is overcooled and is wastefully cooled. As opposed to this, in the present embodiment, as explained above, the temperatures of the upstream side and downstream side MCMs become substantially the same, so wasteful cooling may be reduced.

Note that when the specifications of the MCMs arranged in a line differ and the amounts of heat generated by the bare chips differ, the invention is not limited to making the opening widths of the throttle parts gradually narrower downstream. It is necessary to individually set the opening widths of the throttle parts so that the MCMs become the target temperatures.

Figure 18A:
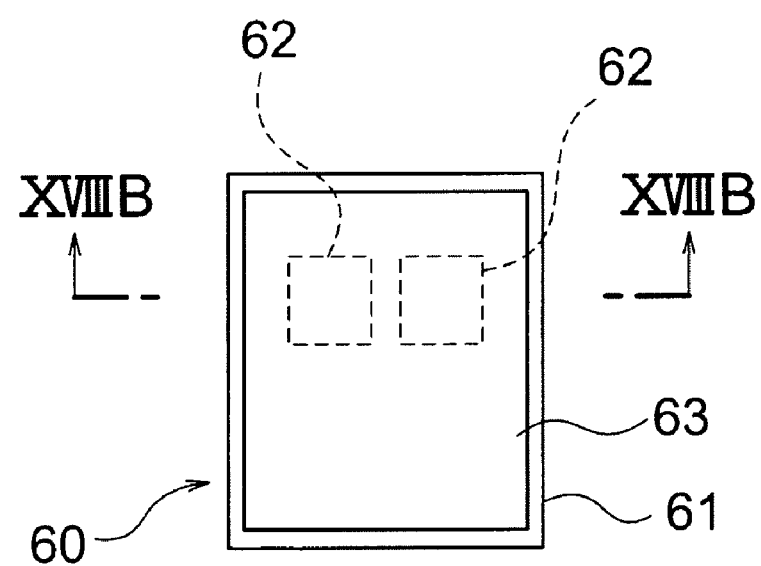
FIG. 18A is a plan view showing a first modification of an electronic device as an object to be cooled.
Figure 18B:
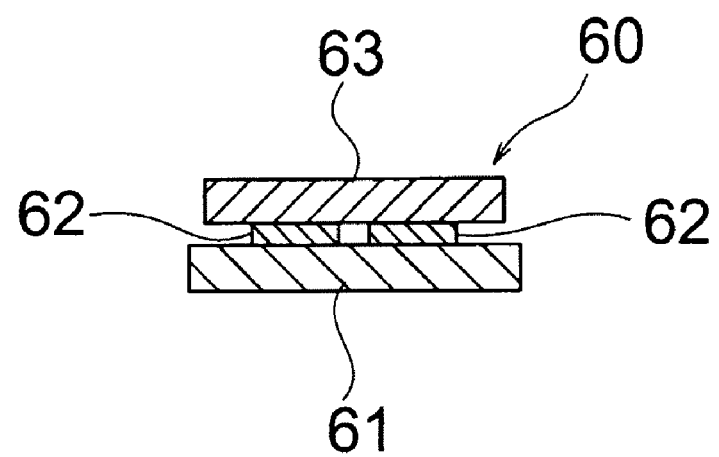
FIG. 18B is a cross-sectional view along a line XVIIIB-XVIIIB of FIG. 18A.
Figure 19A:
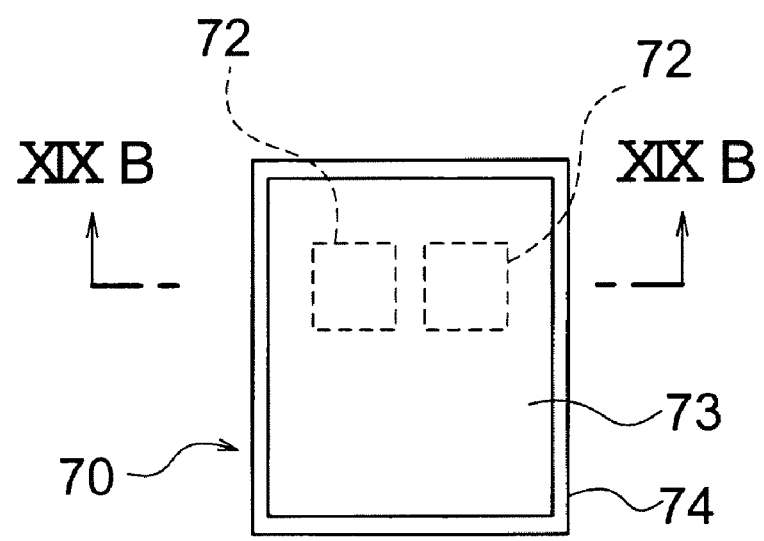
FIG. 19A is a plan view showing a second modification of an electronic device as an object to be cooled.
Figure 19B:
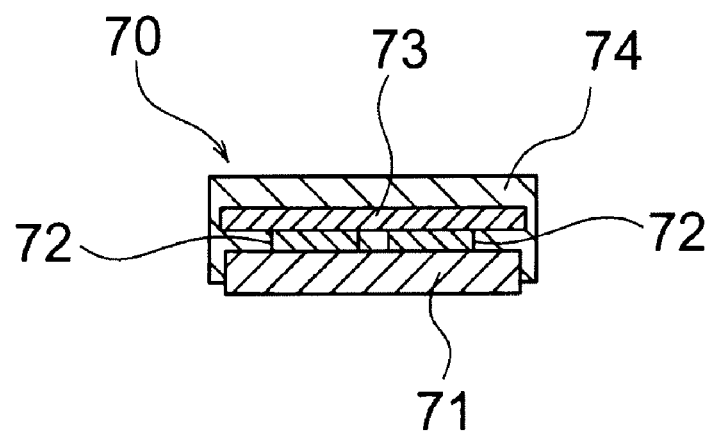
FIG. 19B is a cross-sectional view along a line XIXB-XIXB of FIG. 19A.
Figure 20A:
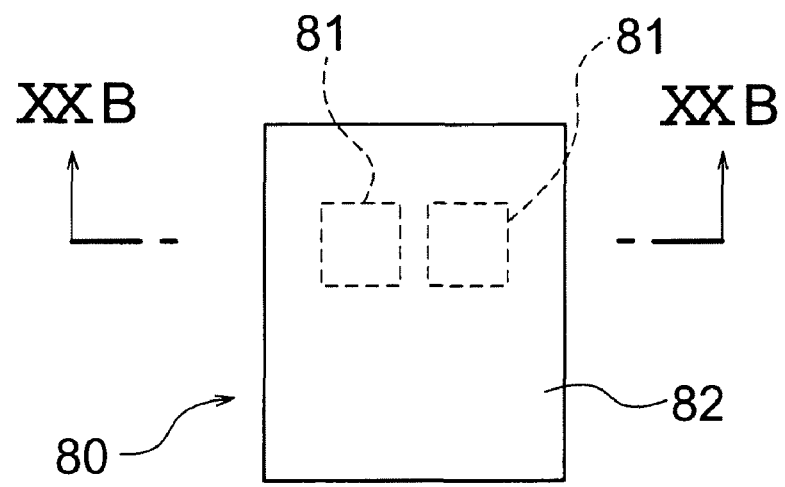
FIG. 20A is a plan view showing a third modification of an electronic as an object to be cooled.
Figure 20B:
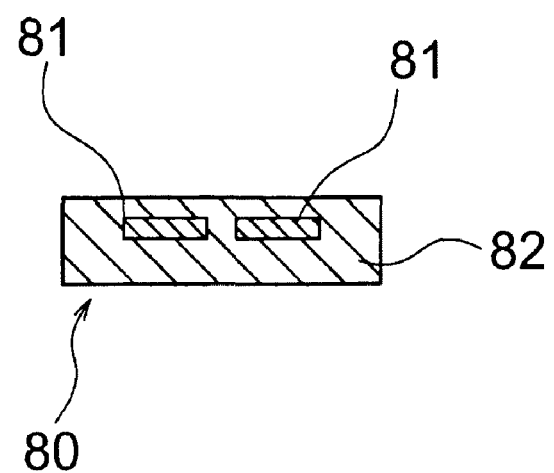
FIG. 20B is a cross-sectional view along a line XXB-XXB of FIG. 20A.

FIG. 18A and FIG. 18B are a plan view and cross-sectional view showing a first modification of an electronic device as an object to be cooled, FIG. 19A and FIG. 19B are a plan view and cross-sectional view showing a second modification of an electronic device as an object to be cooled, and FIG. 20A and FIG. 20B are a plan view and cross-sectional view showing a third modification of an electronic device as an object to be cooled.

The device positioned at the downstream of the throttle part 54, as shown in FIG. 18A and FIG. 18B, may also be an MCM 60 comprising: a module board 61; semiconductor chips 62 mounted on the module board 61; and metal heat radiating fins 63 provided on the semiconductor chips 62. Further, the device positioned at the downstream side of the throttle part 54, as shown in FIG. 19A and FIG. 19B, may be a semiconductor package 70 having a module board 71, semiconductor chip 72, and heat radiating fins 73 sealed by a resin package 74. Alternatively, the device positioned at the downstream side of the throttle part 54, as shown in FIG. 20A and FIG. 20B, may be a semiconductor package 80 having a semiconductor chip 81 sealed by a resin package 82. Note that, positions where the heat radiating fins are attached may be set to any positions other than the top surface of the electronic device.

The present invention is not limited to the electronic devices illustrated above and includes all electronic devices in which semiconductor chips are modularized or packaged. Note that, in each case, the throttle part 54 is provided with a water jacket 50 so as to target the semiconductor chip. Further, when the whole of the electronic device generates heat, the throttle part 54 may be used to raise the flow rate of the coolant and intensively cool a part of the electronic device.

Note that, the embodiments explained above were described to facilitate the understanding of the present invention, but were not described to limit the present invention. Therefore, the elements disclosed in the embodiments include all design equivalents falling under the technical scope of the present invention.

For example, it is also possible to make the throttle part 54 variable in opening width and to enlarge the opening width when stopping the first and second bare chips 222, 223 of the MCM 22A and to narrow the opening width when operating the first and second bare chips 222, 223 so as to raise the cooling efficiency.

Further, in the above embodiments, an electronic device test apparatus in a downstream process using a handler was explained, but the invention is not particularly limited to this. The present invention may also be applied to an electronic device test apparatus in an upstream process using a prober.

The invention claimed is:

1. A water jacket mounted on a board and configured to cool an electronic device mounted on the board by a coolant, the water jacket comprising a channel which accommodates the electronic device and through which the coolant runs, wherein
the channel has a throttle part of which a flow passage sectional area is smaller than other parts and which is at the upstream of the electronic device,
the throttle part causing a flow rate of the coolant to increase in accordance with proximity of the coolant to the throttle part,
the throttle part has an opening width smaller than a length of the electronic device, the length being in a direction parallel to the opening width,
wherein the channel accommodates a plurality of the electronic devices in an aligned state,
a plurality of the throttle parts are respectively provided at the upstream of the electronic devices, and
wherein the plurality of throttle parts have opening widths which are different mutually in accordance with the amounts of generation of heat of the electronic devices.

2. The water jacket as set forth in claim 1, wherein the more the throttle part is downstream, the narrower the opening width of the throttle part is.

* * * * *